United States Patent

Uchiyama

[15] 3,651,336

[45] Mar. 21, 1972

[54] FREQUENCY-DIVIDING CIRCUIT FOR SIGNALS OF SAWTOOTH WAVEFORM

[72] Inventor: Yasuji Uchiyama, Hamakita, Japan

[73] Assignee: Nippon Gakki Seizo Kabushiki Kaisha, Hamamatsu-shi, Japan

[22] Filed: Apr. 23, 1970

[21] Appl. No.: 31,152

[30] Foreign Application Priority Data

Apr. 30, 1969 Japan....................................44/33434
Apr. 30, 1969 Japan....................................44/33435

[52] U.S. Cl................................307/225, 307/228, 307/291, 328/158

[51] Int. Cl.......................................H03k 21/00, H03k 3/12

[58] Field of Search....................328/39, 158; 307/279, 225, 307/228, 291

[56] References Cited

UNITED STATES PATENTS

| | | | |
|---|---|---|---|
| 2,783,382 | 2/1957 | Bode | 328/39 X |
| 3,384,766 | 5/1968 | Kardash | 307/279 X |

*Primary Examiner*—John S. Heyman
*Attorney*—Holman and Stern

[57] ABSTRACT

A frequency-dividing circuit for producing a sawtooth wave comprises at least one stage of a square wave frequency divider and a mixing circuit. Receiving a sawtooth wave or a square wave of a known frequency as a trigger input signal, the square wave frequency diver produces a square wave of half the frequency. The mixing circuit includes: resistors for mixing a sawtooth wave of the original frequency and the frequency divided square wave by equal peak amplitudes thus producing a sawtooth wave of half the frequency; a transistor amplifier of an emitter follower type for supplying the resultant sawtooth wave to a succeeding state; and a further transistor amplifier of an emitter follower type for supplying the resultant sawtooth wave to an output terminal.

3 Claims, 3 Drawing Figures

INVENTOR

*Yasuji Uchiyama*

BY *Holman, Glascock, Downing & Seebold*

ATTORNEYS

INVENTOR
Yasuji Uchiyama
BY Holman, Glascock, Downing & Seebold
ATTORNEYS

FREQUENCY-DIVIDING CIRCUIT FOR SIGNALS OF SAWTOOTH WAVEFORM

BACKGROUND OF THE INVENTION

This invention relates to a frequency dividing circuit for producing a sawtooth waveform comprising frequency dividers which circuit is adapted for direct connection of each of frequency dividers and is not unfavorably affected by a succeeding stage, and the output impedance of which is small, whereby the circuit is adaptable to an integrated circuit.

Hitherto, a frequency-dividing circuit organized by connecting a plurality of flip-flop circuits or a plurality of blocking oscillators in cascade has been conventionally used as a frequency divider for use in connection with electronic musical instruments.

However, these conventional frequency dividers have various disadvantages as well as various advantages. That is, since a frequency divider utilizing flip-flop circuits can carry out frequency dividing operation within a broad frequency range having no limitation, it is very easy to manufacture the frequency divider in the case when a plurality of the frequency dividers are to be used, but since their output waves are of square form and contain only harmonic frequencies of odd order without containing harmonic frequencies of even order, these output waves are inadequate and incomplete for practical use as a sound source in electronic musical instruments.

On the other hand, the output waves of a frequency divider comprising cascaded blocking oscillator circuits is of sawtooth waveform, so that these output waves have all harmonic components, which means that the frequency divider is ideal as a sound source. However, the blocking oscillator circuit itself is liable to produce a free-running oscillation of a particular frequency in the case when no synchronizing means is applied thereto, that is, the circuit includes therein a time-constant circuit the time constant of which is determined by the capacitance of a capacitor, the resistance of a resistor, characteristics of active elements, a bias voltage, a power source voltage, and the like. Accordingly, the blocking oscillator circuit is affected by fluctuations of the above-mentioned values of various elements and variations of voltages and temperature, whereby the frequency of the free-running oscillation is liable to be varied.

Furthermore, when the blocking oscillator circuit is used as a half-frequency divider by applying synchronization thereto, the frequency of the input synchronous signal is required to be higher than double value and lower than triple value of its free-running oscillation frequency, so that its operating frequency is limited. Accordingly, for the purpose of obtaining a desired operation frequency, the values of the circuit elements such as capacitors and resistors should be selected to match the desired frequency. In the case where the frequency divider is used as a sound source circuit of a musical instrument, the elements of the circuit must be individually designed so as to be mutually different from those of other circuits in order to cover a frequency range over several octaves, which may cause difficulty in manufacture of the above-mentioned circuits and in the application thereof to an integrated circuit. Furthermore, as the sound frequency approaches the bass region, a larger time-constant is required. In this case, a capacitor of larger capacitance is required, thus causing higher cost and bulkiness of the circuit.

SUMMARY OF THE INVENTION

It is an essential object of the invention to provide a frequency-dividing circuit for signals of sawtooth waveform having none of the disadvantages of the conventional frequency-dividing circuits as described above and more particularly to provide a frequency divider favorably adapted for integrated circuits, since each of a plurality of frequency dividing circuits comprising transistors, diodes and resistors and not comprising capacitors can be constructed commercially over a wide frequency range.

It is another object of the invention to provide a frequency-dividing circuit for producing signals of sawtooth waveform in which direct connection of each of frequency-dividing stages can be easily attained without the influence of the succeeding stage, and the impedances at each of the output terminals of the frequency-divided signals are small.

It is still another object of the invention to provide a frequency-dividing circuit for producing sawtooth waveform, which circuit is divided into two parts, that is, a digital integrated circuit and a linear integrated circuit to prevent unfavorable heat effects between them, and in which it is extremely easy to fabricate the above-mentioned linear integrated circuit part.

The features and functions of the invention will become more apparent from the following detailed description and the appended claims when read in connection with the accompanying drawings, in which like parts are designated by like reference numerals.

DETAILED DESCRIPTION OF THE INVENTION

Figure 1:
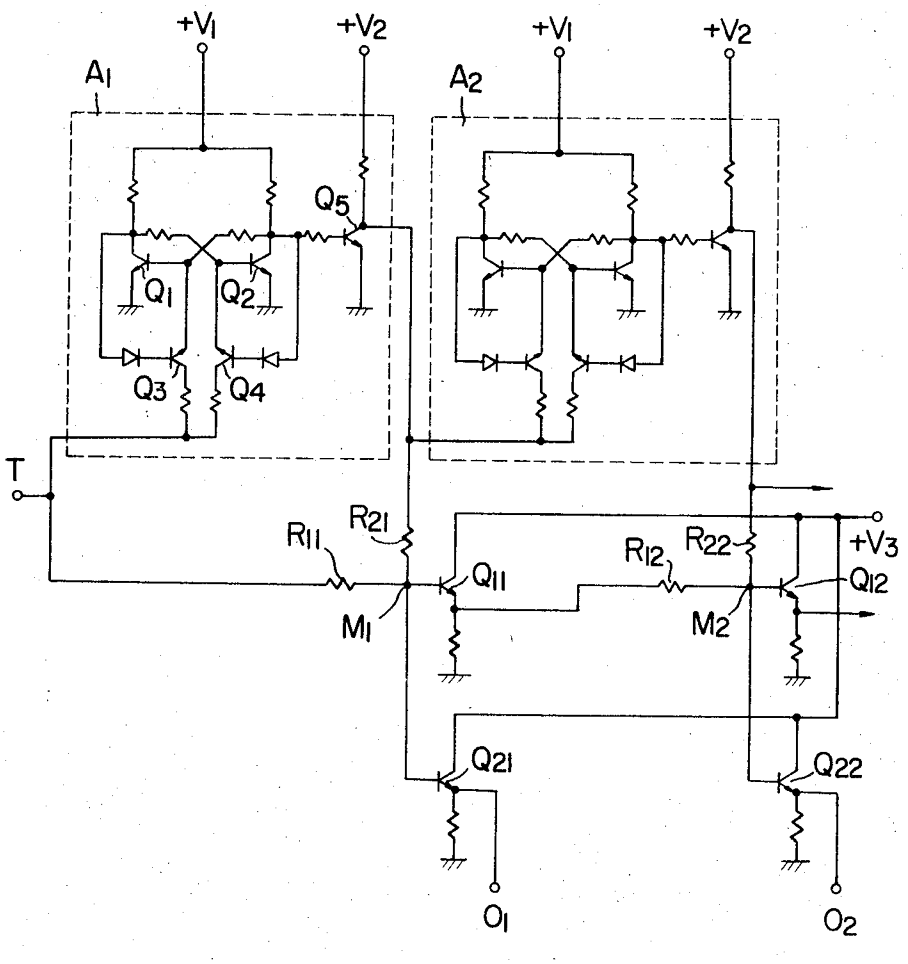
FIG. 1 is a circuit connection diagram showing an embodiment of the invention.

Referring to FIG. 1, a square wave frequency-dividing circuit $A_1$ is composed of a bistable multivibrator comprising transistors $Q_1$, $Q_2$, $Q_3$, and $Q_4$, and an amplifying transistor $Q_5$, and a sawtooth wave signal applied to terminal T and having a frequency of $f$ is divided into a square wave having a frequency of one-half $f$. On the other hand, a sawtooth wave having a frequency $f$ is applied to the base of transistor $Q_{11}$ through the resistor $R_{11}$, and an output wave of the square wave dividing circuit $A_1$ having a frequency of one-half $f$ is also applied to the base of transistor $Q_{11}$ through the resistor $R_{21}$ in the state of a peak amplitude equal to that of the sawtooth wave applied through the resistor $R_{11}$ to the base of transistor $Q_{11}$. Accordingly, the emitter of the transistor $Q_{11}$ presents an output sawtooth wave having a frequency of one-half $f$, which is a resultant of mixing and superposing a square wave having a frequency of one-half $f$ and a sawtooth wave having a frequency $f$ and which in turn is supplied to the succeeding stage. The base of a buffer transistor $Q_{21}$ is connected to the connection point $M_1$ between resistor $R_{11}$ and resistor $R_{21}$, whereby a frequency-divided sawtooth wave having a frequency of one-half is derived from the emitter of the buffer transistor $Q_{21}$ as a tone generator output at a terminal $O_1$.

The reason why the output signal of each of the frequency-dividing stages is derived according to the invention from a buffer transistor such as $Q_{21}$ and not from the emitter side of the transistor $Q_{11}$ is that the output of the said frequency-dividing stage is not affected by the signal of the succeeding stage coming back through resistor $R_{12}$, and that the output impedance of each of the frequency-dividing stages is made small at the output terminal.

A square wave frequency-dividing circuit $A_2$ is organized similarly to the circuit $A_1$ described above, in which an output square wave of the frequency-dividing circuit $A_1$ is utilized as a trigger input signal thereof. Therefore, an output square wave of the frequency-dividing circuit $A_2$ having a frequency of one-fourth $f$ is applied through resistor $R_{22}$ to the connection point $M_2$, that is, the bases of transistors $Q_{12}$ and $Q_{22}$ so that the peak amplitude of the output square wave will be equal to that of sawtooth wave having a frequency of one-half $f$ applied from the preceding stage through resistor $R_{12}$ to the connection point $M_2$. Consequently, an output sawtooth wave having a frequency of one-fourth $f$ can be obtained from the emitter of the transistor $Q_{12}$, which is created by mixing and superposing a square wave having a frequency of one-fourth $f$ and a sawtooth wave having a frequency of one-half $f$, whereby the resultant sawtooth wave is supplied to the succeeding stage. On the other hand, a sawtooth wave having a frequency of one-fourth $f$ is derived from the emitter of the transistor $Q_{22}$ as a tone generation output at a terminal $O_2$, and similarly each of the frequency-divided sawtooth waves can be, in turn, obtained from each of the succeeding frequency-dividing stages.

The square wave frequency-dividing circuits $A_1$, $A_2$, —, are bistable multivibrators which are well known but include no capacitance elements, thereby facilitating application of the sawtooth wave frequency-dividing circuit according to the invention to integrated circuits. Moreover, since no capacitor is necessary in the circuit comprising mixing transistors and buffer transistors, it becomes, as a whole, extremely easy to apply the sawtooth wave frequency-dividing circuit according to the invention to integrated circuits.

Figure 2:
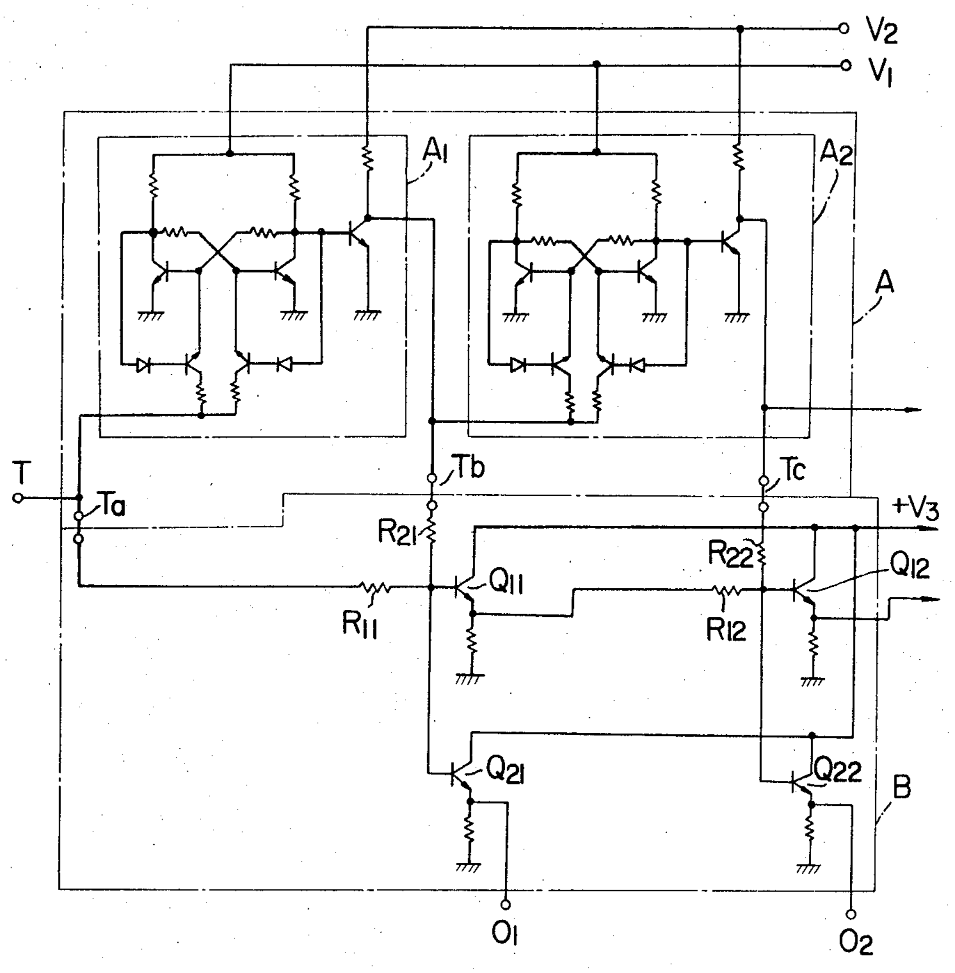
FIG. 2 is a circuit connection diagram showing another embodiment of the invention.

Referring to another embodiment of the invention shown in FIG. 2, the circuit is divided into two portions according to the operation, one portion including flip-flops and amplifiers therefor and performing on-off operation, and the other portion including mixing amplifiers and performing sawtooth amplification. The former portion is called a digital portion and the latter a linear portion. The two portions, i.e., digital integrated circuit A and linear integrated circuit B which are individually fabricated, are interconnected by terminals T*a*, T*b* and T*c*. In the portion of digital integrated circuit A, numerals $A_1$ and $A_2$ designate respectively square wave frequency-dividing circuits composed of bistable multivibrators, which supply a square wave having a frequency of one-half $f$ ($f$: frequency of an input signal) to an output side thereof. When a sawtooth wave having a frequency $f$ is applied to the terminal T, the square wave frequency-dividing circuit $A_1$ supplies a square wave having a frequency one-half $f$ to the output side thereof, this output square wave being applied through resistor $R_{21}$ to the bases of transistor $Q_{11}$ and $Q_{21}$. On the other hand, a sawtooth wave from the terminal T is also applied through resistor $R_{11}$ to the bases of transistor $Q_{11}$ and $Q_{21}$. In this case, values of the resistor $R_{11}$ and $R_{21}$ are predetermined so as substantially to equalize the peak amplitudes of the square wave from the square wave frequency-dividing circuit $A_1$ and the sawtooth wave from the terminal T. Therefore, a frequency-divided sawtooth wave having one-half of the frequency of the sawtooth wave from the terminal T can be obtained from the emitter of transistor $Q_{11}$ as a mixing component for the next stage and from the emitter of transistor $Q_{21}$ as a tone generator output at a terminal $Q_1$. The frequency-divided sawtooth wave thus obtained is applied to a mixing resistor $R_{12}$ of the succeeding stage to produce the frequency-divided sawtooth wave thereof. Although the transistor $Q_{11}$ is provided for supplying a sawtooth wave which produces a frequency-divided sawtooth wave in the succeeding stage, a buffer transistor $Q_{21}$ is separately provided in the output side this stage thereby to derive an output signal from the emitter side of the buffer transistor $Q_{21}$. Such an arrangement is provided to reduce the output impedance and to prevent the output of said stage from being unfavorably affected by signals back from the succeeding stage through the resistor $R_{12}$.

Figure 3:
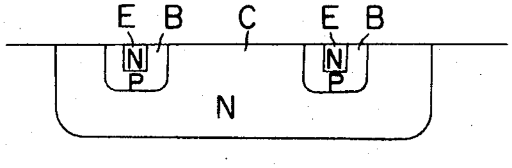
FIG. 3 is a cross sectional view of the integrated circuit of the transistor in a linear part shown in FIG. 2.

The collectors of transistors $Q_{11}$, $Q_{12}$ ...... of each frequency-dividing stage can be commonly connected and the collectors of output transistors $Q_{21}$, $Q_{22}$....... can be also commonly connected. Therefore, when such a circuit is built in the form of an integrated circuit as shown in FIG. 3, its production is greatly simplified since there is no necessity for separation between transistors, wherein C indicates a common collector while E's and B's indicate separate emitters and bases.

Moreover, since transistors $Q_{11}$, $Q_{12}$ ....... and transistors $Q_{21}$, $Q_{22}$ ....... perform class "A" amplifying operation, much heat is generated, but since the portion A consisting of the digital integrated circuit and the portion B consisting of the linear integrated circuit are individually fabricated, unfavorable effect on the digital integrated circuit due to heat generation is completely eliminated thereby rendering the operation of the circuit described above stable.

I claim:

1. A frequency-dividing circuit for producing a sawtooth wave including at least one stage which comprises: a square wave frequency divider circuit for producing a square wave of frequency half of an applied sawtooth signal frequency; a mixing circuit including a connection point and resistors connected between said connection point and an output of said frequency divider circuit, and between the same connection point and an input applied signal stage, to equalize before mixing, the peak amplitudes of the frequency divider output wave and the applied sawtooth signal wave; a first transistor amplifier of an emitter-follower type connected to said connection point for feeding an output from said mixing circuit to a succeeding stage; and an additional transistor amplifier of an emitter follower type also connected to said connection point, an emitter of which is connected to a stage output terminal to deliver a mixed resultant wave which is not affected by any signal feed back from the succeeding stage.

2. A frequency dividing circuit for producing a sawtooth wave including at least one stage which comprises: a square wave frequency divider circuit for producing a square wave of frequency half of an applied sawtooth signal frequency; a mixing circuit including a connection point and resistors connected between said connection point and an output of said frequency divider circuit, and between the same connection point and an input applied signal stage, to equalize before mixing, the peak amplitudes of the frequency divider output wave and the applied sawtooth signal wave; a first transistor amplifier of an emitter-follower type connected to said connection point for feeding an output from said mixing circuit to a succeeding stage; and an additional transistor amplifier of an emitter follower type also connected to said connection point, an emitter of which is connected to a stage output terminal to deliver a mixed resultant wave which is not affected by any signal feed back from the succeeding stage, said square wave frequency divider being part of a first integrated circuit, and said mixing circuit being part of a second integrated circuit.

3. A frequency dividing circuit for producing a sawtooth wave including a plurality of stages connected in cascade, each stage comprising: a square wave frequency divider circuit for producing a square wave of frequency half of an applied sawtooth signal frequency; a mixing circuit including a connection point and resistors connected between said connection point and an output of said frequency divider circuit, and between the same connection point and an input applied signal stage, to equalize before mixing, the peak amplitudes of the frequency divider output wave and the applied sawtooth signal wave; a first transistor amplifier of an emitter-follower type connected to said connection point for feeding an output from said mixing circuit to a succeeding stage; and an additional transistor amplifier of an emitter follower type also connected to said connection point, an emitter of which is connected to a stage output terminal to deliver a mixed resultant wave which is not affected by any signal feed back from the succeeding stage, the circuit for providing said saw tooth wave characterized in that the square wave frequency dividers of said plurality of stages are part of a first-integrated circuit, and the mixing circuits and said first and additional transistor amplifiers forming part of a second integrated circuit, the arrangement also including a common collector point to which the collectors of the first and additional transistor amplifiers of the plurality of stages are connected.

* * * * *